United States Patent
Kim et al.

(10) Patent No.: US 9,748,366 B2
(45) Date of Patent: Aug. 29, 2017

(54) ETCHING OXIDE-NITRIDE STACKS USING $C_4F_6H_2$

(71) Applicant: Applied Materials, Inc., Santa Clara, CA (US)

(72) Inventors: Jong Mun Kim, San Jose, CA (US); Kenny L. Doan, San Jose, CA (US); Li Ling, San Jose, CA (US); Jairaj Payyapilly, Sunnyvale, CA (US); Srinivas D. Nemani, Sunnyvale, CA (US); Daisuke Shimizu, Sunnyvale, CA (US); Yuju Huang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 215 days.

(21) Appl. No.: 14/491,828

(22) Filed: Sep. 19, 2014

(65) Prior Publication Data
US 2015/0097276 A1 Apr. 9, 2015

Related U.S. Application Data

(60) Provisional application No. 61/886,542, filed on Oct. 3, 2013.

(51) Int. Cl.
| H01L 21/31 | (2006.01) |
| H01L 29/66 | (2006.01) |
| H01L 21/311 | (2006.01) |

(52) U.S. Cl.
CPC .. H01L 29/66833 (2013.01); H01L 21/31116 (2013.01)

(58) Field of Classification Search
USPC ............ 216/67, 72; 438/689, 719, 738
See application file for complete search history.

(56) References Cited

U.S. PATENT DOCUMENTS

| 5,176,790 A * | 1/1993 | Arleo ............... H01L 21/76802 438/738 |
| 5,310,454 A | 5/1994 | Ohiwa et al. |
| 6,184,150 B1 | 2/2001 | Yang et al. |
| 6,322,716 B1 * | 11/2001 | Qiao ................... H01J 37/321 216/67 |
| 6,451,703 B1 | 9/2002 | Liu et al. |
| 6,602,434 B1 | 8/2003 | Hung et al. |
| 6,849,193 B2 | 2/2005 | Hung et al. |
| 2003/0162395 A1 * | 8/2003 | Trapp ............... H01L 21/31144 438/689 |
| 2005/0042876 A1 | 2/2005 | Kobayashi et al. |
| 2009/0176375 A1 * | 7/2009 | Benson ................. C09K 13/00 438/719 |

(Continued)

FOREIGN PATENT DOCUMENTS

| DE | 10224137 A1 | 12/2003 |
| JP | 07-335611 | * 12/1995 |
| WO | 03/100843 A2 | 12/2003 |

*Primary Examiner* — Archene Turner
(74) *Attorney, Agent, or Firm* — Lowenstein Sandler LLP

(57) ABSTRACT

An article having alternating oxide layers and nitride layers is etched by an etch process. The etch process includes providing a first gas comprising $C_4F_6H_2$ in a chamber of an etch reactor, ionizing the $C_4F_6H_2$ containing gas to produce a plasma comprising a plurality of ions, and etching the article using the plurality of ions.

20 Claims, 6 Drawing Sheets

(56) References Cited

U.S. PATENT DOCUMENTS

2011/0028769 A1   2/2011   Sun et al.
2012/0085959 A1*  4/2012   Uenveren ................ C08J 9/146
                                                    252/2

* cited by examiner

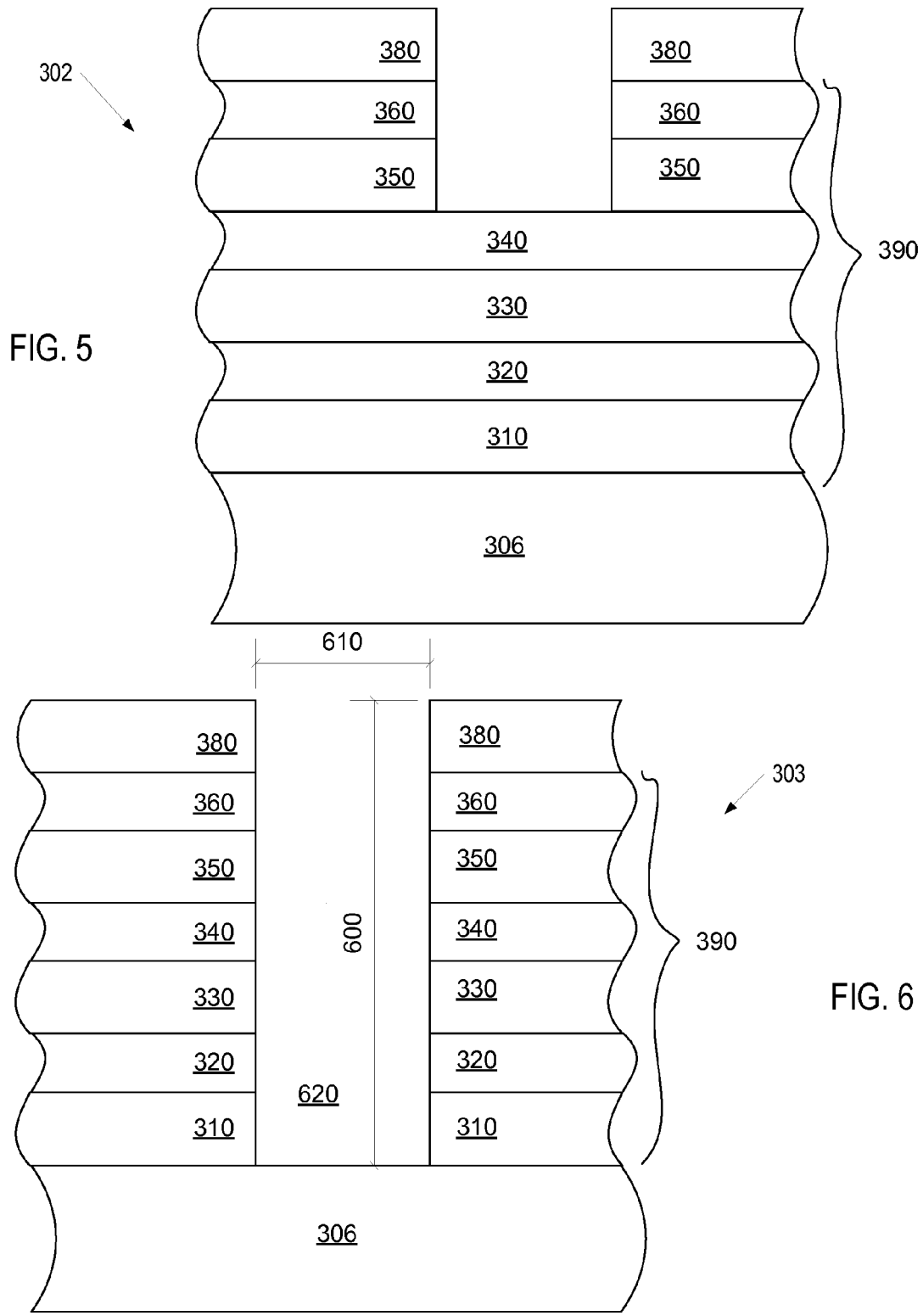

ETCHING OXIDE-NITRIDE STACKS USING $C_4F_6H_2$

RELATED APPLICATIONS

This patent application claims the benefit under 35 U.S.C. §119(e) of U.S. Provisional Application No. 61/886,542, filed Oct. 3, 2013.

FIELD OF THE INVENTION

Embodiments of the present invention relate, in general, to etching of substrates and other materials. In particular, embodiments of the present invention relate to etching silicon oxide and silicon nitride and related materials.

BACKGROUND

The production of silicon integrated circuits has placed difficult demands on fabrication steps to increase the number of devices while decreasing the minimum feature sizes on a chip. These demands have extended to fabrication steps including depositing layers of different materials onto difficult topologies and etching further features within those layers. This is especially an issue in the manufacturing of next generation Negated AND or NOT AND (NAND) flash memory.

NAND is a type of non-volatile storage technology that does not require power to retain data. It is used primarily in main memory (of a computer for example), memory cards, universal serial bus (USB) flash drives, sold-state drives and such for general storage and transfer of data. To increase memory capacity within the same physical space, a three-dimensional NAND (3D NAND) design has been developed. Such a design introduces alternating oxide layers and nitride layers which are etched to produce a desired structure.

Etching a stack of alternating oxide layers and nitride layers effectively and efficiently with the appropriate critical dimensions and aspect ratios is a challenging task. Etching alternating oxide layers and nitride layers with high aspect ratios has presented difficult challenges, and is inefficient and costly using conventional gas mixtures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 5 depicts a sectional view of one embodiment of multiple oxide layers and nitride layers on a substrate where an oxide layer and a nitride layer have been etched.

FIG. 6 depicts a sectional view of one embodiment of multiple oxide layers and nitride layers on a substrate where a cavity has been etched down to the substrate.

DETAILED DESCRIPTION

3D NAND flash memory represents the next generation in memory technology. 3D NAND offers greater data storage in a smaller space. However, creating a 3D NAND structure presents some fabrication issues. One of these issues is etching alternating oxide layers and nitride layers in an efficient and cost effective process to produce high aspect ratio (HAR) features. Alternating oxide layers and nitride layers are included in the design of 3D NAND flash and are ultimately used in creating a device's memory gates. The current fabrication processes for etching multiple alternating oxide layers and nitride layers to produce high aspect ratio features typically use complex recipes, multiple process steps and a multitude of conventional etch gases. This additional processing adds to processing costs and decreases process efficiency, and further makes it difficult to create specialized high aspect ratio features. Embodiments of the present invention simplify and improve on conventional etch processes by introducing new gas mixtures and/or etch chemistries that use $C_4F_6H_2$.

Embodiments of the present invention provide a process to etch high aspect ratio features into a stack of alternating oxide layers and nitride layers. The etching of an oxide-nitride stack may be performed in a single etch process using an optimized gas mixture in one embodiment. The optimized gas mixture includes a $C_4H_6F_2$ gas. $C_4H_6F_2$, when ionized, is able to create a plasma suitable for etching high aspect ratio features into a stack of alternating oxide layers and nitride layers. Other gases, for example hydrogen-free fluorocarbons (e.g., $C_4F_8$, $C_4F_6$), $CH_2F_2$, Ar, $N_2$ or $O_2$ may be added to the gas mixture to improve or control oxide etch rates and/or nitride etch rates. Additionally, some of these gases may be introduced for polymer generation control or as a carrier gas.

Embodiments of the present invention provide a method to create a cavity in a stack of alternating oxide layers and nitride layers using $C_4F_6H_2$ in a chamber of an etch reactor. The $C_4F_6H_2$ containing gas is ionized producing plasma with many ions, radicals and various molecules. These ions and various molecules etch oxide and nitride layers on a substrate creating features, some of which have high aspect ratios.

Figure 1:
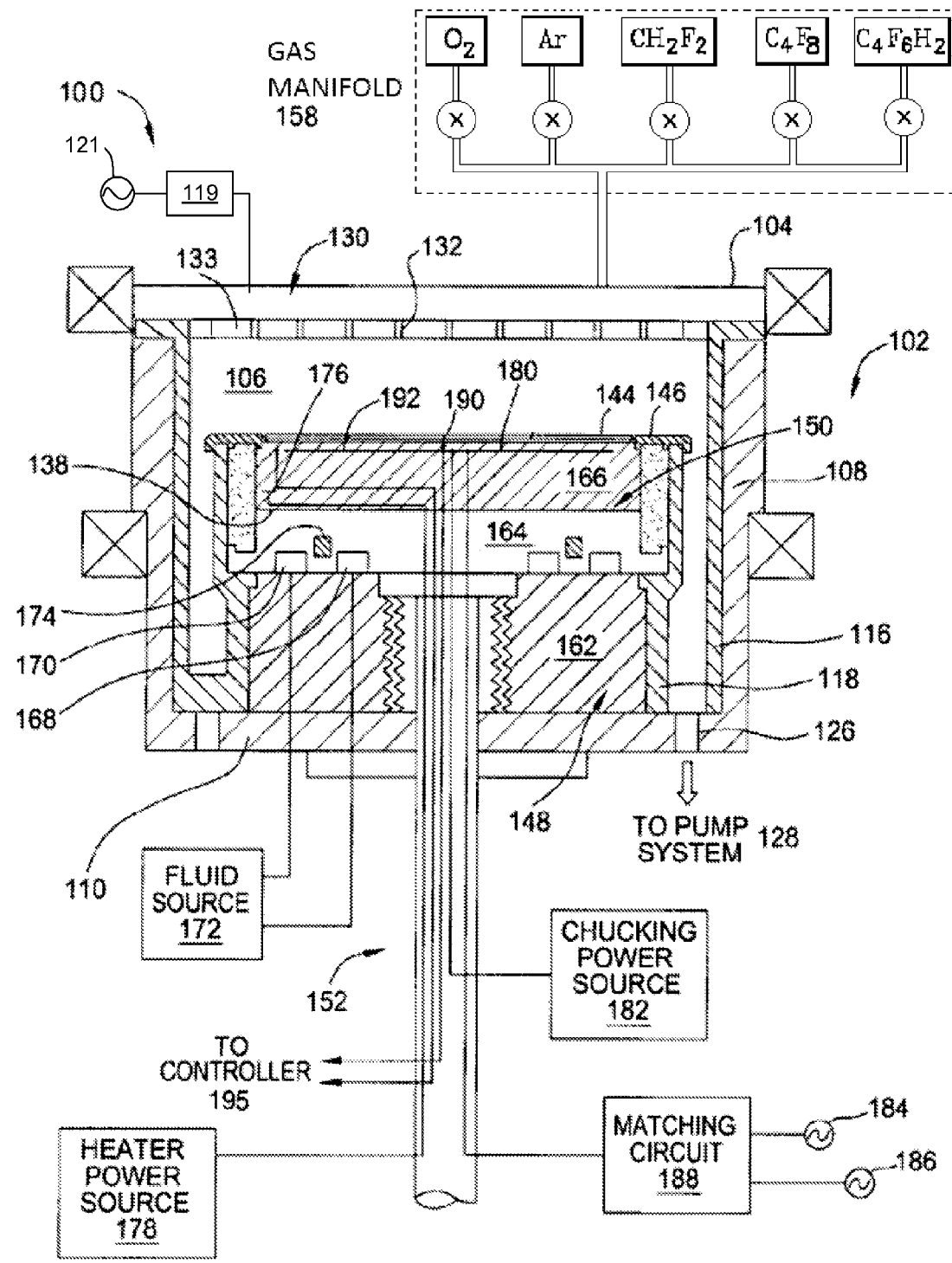
FIG. 1 depicts a sectional view of one embodiment of a processing chamber.

FIG. 1 is a sectional view of a semiconductor processing chamber 100 which may be used for processes in which a corrosive plasma environment is provided. For example, the processing chamber 100 may be a chamber for a plasma etcher or plasma etch reactor. Some examples of plasma etchers include reactive ion etch reactors (e.g., a magnetically enhanced reactive ion etch (MERIE) plasma reactor), inductively coupled plasma etch reactors (e.g., an inductively coupled pulsed plasma etch reactor), and so forth. The processing chamber 100 includes a chamber body 102 and a showerhead 130 that enclose an interior volume 106. Alternatively, the showerhead 130 may be replaced by a lid and a nozzle in some embodiments. The chamber body 102 generally includes sidewalls 108 and a bottom 110. An outer liner 116 may be disposed adjacent the sidewalls 108 to protect the chamber body 102.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas manifold 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes a gas distribution plate (GDP) 133 having multiple gas delivery holes 132 throughout the GDP 133. For processing chambers used for conductor etch (etching of conductive materials), a lid may be used rather than a showerhead. The lid may include a center nozzle that fits into a center hole of the lid. Examples of processing gases that may be delivered by the gas manifold 158 and used to process substrates in the processing chamber 100 include halogen-containing and/or fluorocarbon gases, such as $C_4F_6H_2$, $C_2H_2F_2$, $C_2F_8$, $C_2F_6$, $SF_6$, $SiCl_4$, HBr, $NF_3$, $CF_4$, $CHF_3$, $NF_3$, $Cl_2$, and $SiF_4$, among others, and other gases such as $O_2$, or $N_2O$. Examples of carrier gases include $N_2$, He, Ar, and other gases inert to process gases (e.g., non-reactive gases).

The substrate support assembly 148 is disposed in the interior volume 106 of the processing chamber 100 below the showerhead 130 or lid. The substrate support assembly 148 holds the substrate 144 during processing. A ring 146 (e.g., a single ring) may cover a portion of the electrostatic chuck 150, and may protect the covered portion from exposure to plasma during processing. An inner liner 118 may be coated on the periphery of the substrate support assembly 148.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using multiple temperature sensors 190, 192, which may be monitored using a controller 195.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100.

The showerhead 130 or lid may act as an upper electrode and/or the substrate support assembly may act as a lower electrode in some embodiments. The showerhead 130 or lid may be connected via another matching circuit 119 to a high frequency RF power source 121 that may generate a high frequency magnetic field to produce a plasma. The one or more RF power sources 184, 186, 121 are generally capable of producing RF signal having a frequency from about 50 kHz to about 3 GHz and a power of up to about 10,000 Watts. In one embodiment, a frequency of 100-200 MHz and a power of 150-350 W is used to produce the plasma.

Figure 2:
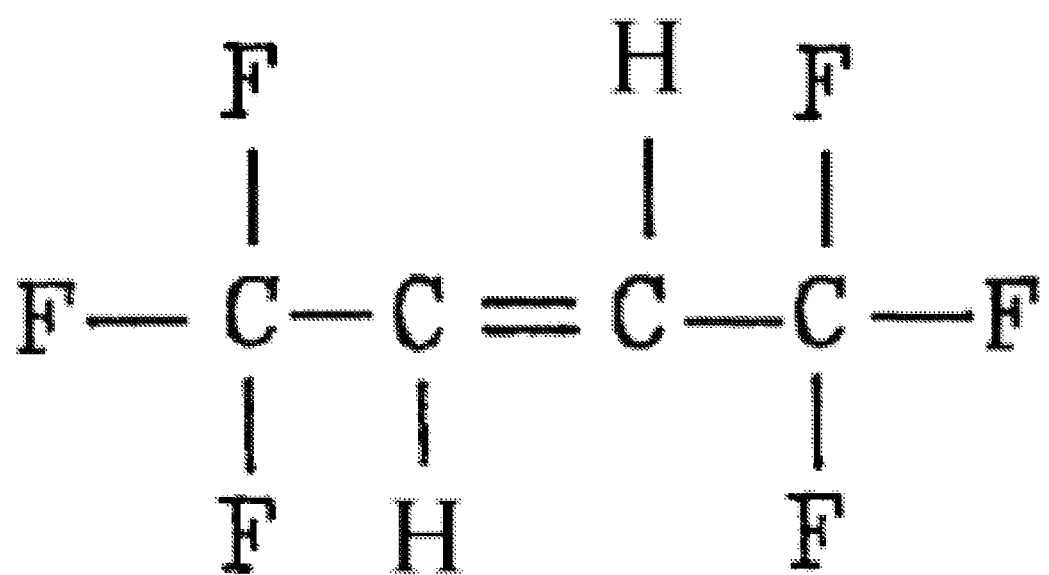
FIG. 2 depicts one isomer of a $C_4F_6H_2$ gas that may be used in one embodiment of an etch process.

FIG. 2 depicts one isomer of a $C_4F_6H_2$ molecule that may be used in one embodiment of an etch process. The illustrated $C_4F_6H_2$ isomer contains one double bond between a second carbon molecule and a third carbon molecule. One hydrogen molecule is on one side of the double bond while another hydrogen molecule is on the other side of the double bond. Numerous other $C_4F_6H_2$ isomers may be included in a $C_4F_6H_2$ gas and there is no limitation to have only one $C_4F_6H_2$ isomer.

When a $C_4F_6H_2$ gas is ionized in a processing chamber, a plasma of varying ionic species is created. Some of these species are presented in Tables 1 and 2 below. Table 2 also depicts a possible breakdown percentage of various dissociated species for a plasma generated using $C_4F_6H_2$. Some of these molecular species will physically etch the oxide layers. Other species will chemically etch the nitride layers.

TABLE 1

Gas Initial Species & Dissociated Species

| Process Gas | $CH_2F_2$ | $C_4F_8$ | $C_4F_6$ | $C_4F_6H_2$ |
|---|---|---|---|---|
| Dissociated Species | $CHF_2$ | $CF_2^{+,*}$ | $C_2F_2^*$ | $C_2F_3H^+$ |
| | $CHF^+$ | $C_2F_2^*$ | $CF_2^{*,+}$ | $C_2F_2H_2$ |
| | $CF_2^{*,+}$ | | $CF_3^+$ | $CHF^+$ |
| | $CH_2$ | | | $CF_2^{+,*}$ |
| | | | | $CF_3^+$ |
| | | | | $C_2F_2^*$ |
| | | | | $C_3F_3H_2^+$ |

TABLE 2

Ratio of Dissociated Species for C4F6H2

| Dissociated Species | $1^{st}$ Range (%) | $2^{nd}$ Range (%) |
|---|---|---|
| $C_3F_3H_2$ | 37-84 | 37-47 |
| $CF_3$ | 8-28 | 26-28 |
| $C_4F_5H_2$ | 8-14 | 13-14 |
| $C_3F_2H$ | 0-11 | 10-11 |
| CF | 0-10 | 1-10 |
| $CF_2$ | 0-3 | 1-2 |

Table 1 shows the dissociated species that a gas mixture used for a plasma etch process may produce in one embodiment. In one embodiment, a gas mixture of $C_4F_6H_2$, $C_4F_6$, and $CH_2F_2$ is used in a plasma process. Such a gas mixture may produce the dissociated species of $CHF_2$, $CHF$, $CF_2$, $CH_2$, $CF_3$, $C_2F_3H$, $C_2F_2H_2$, and $C_3F_3H_2$, for example. In another embodiment, a gas mixture of $C_4F_6H_2$, $C_4F_8$, and $CH_2F_2$ is used in a plasma process. Such a gas mixture may produce the same dissociated species of $CHF_2$, $CHF$, $CF_2$, $CH_2$, $CF_3$, $C_2F_3H$, $C_2F_2H_2$, and $C_3F_3H_2$, but in different proportions. In another embodiment, a gas mixture of $C_4F_6H_2$ and $C_4F_8$ is used in a plasma process. Such a gas mixture may produce the dissociated species of $CHF$, $CF_2$, $CF_3$, $C_2F_3H$, $C_2F_2H_2$, and $C_3F_3H_2$. In another embodiment, a gas mixture of $C_4F_6H_2$ and $C_4F_6$ is used in a plasma process. Such a gas mixture may produce the dissociated species of $CHF$, $CF_2$, $CF_3$, $C_2F_3H$, $C_2F_2H_2$, and $C_3F_3H_2$, but in different proportions. In other embodiments, the $C_4F_6$, $C_4F_8$ and/or $CH_2F_2$ of any of the above mentioned embodiments may be replaced with other fluorocarbons that are combined with $C_4F_6H_2$. In all of the above described embodiments, polymer reducing gases such as $O_2$ and $N_2$ and carrier gases such as Ar may also be added to the fluorocarbon gases.

Table 2 shows the species breakdown ratios for a $C_4F_6H_2$ gas. The ratios of the different dissociated species shown in table 2 may depend on a magnetic field strength and/or a residence time of the gas mixture in the process chamber. When heavy fluorocarbon molecules enter a plasma, the fluorocarbon molecules are progressively dissociated into smaller entities. The longer the fluorocarbon molecules are in the field, and the stronger the electromagnetic field, the more the fluorocarbon molecules break down. The second range of dissociated species represents a higher strength electromagnetic field than the first range of dissociated species. Other ranges of dissociated species may be attained by adjusting the magnetic field strength and time in chamber.

Figure 3:
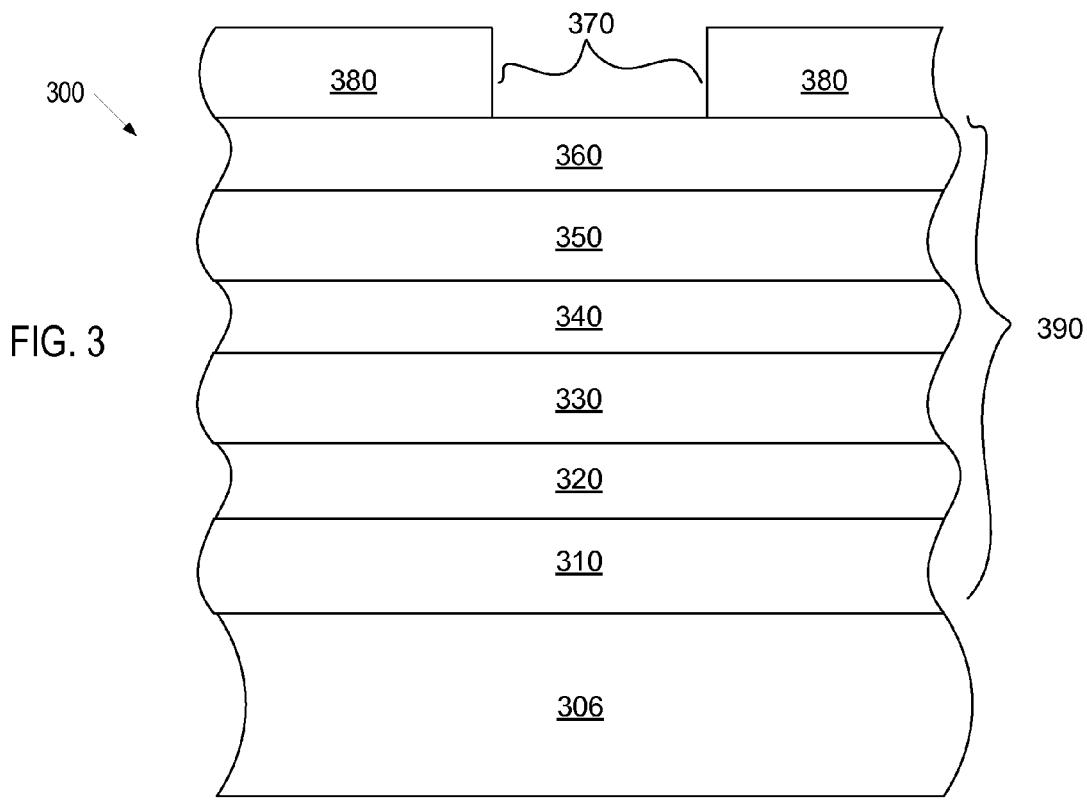
FIG. 3 depicts a sectional view of one embodiment of multiple oxide layers and nitride layers on a substrate.

FIG. 3 displays a sectional view of an article 300 including a substrate 306 having a stack of alternating oxide layers and nitride layers. The substrate 306 includes oxide layers 360, 340, 320 and nitride layers 350, 330, 310 in a stack 390. In one embodiment, oxide layers 360, 340, 320 are $SiO_2$ layers and nitride layers 350, 330, 310 are $Si_3N_4$ layers. Other oxide layers having the form $SiO_x$ may also be used. Additionally, other nitride layers may also be used. The nitride layers may be 0% to 200% thicker than the oxide layers in one embodiment. In one embodiment, the nitride layers are approximately 20% thicker than the oxide layers. In one embodiment, all of the oxide layers have approximately the same thickness, and all of the nitride layers may have approximately the same thickness, which may be different than the oxide thickness. Alternatively, different oxide layers may have different thicknesses and/or different nitride layers may have different thicknesses.

A pattern mask 380 covers a top layer 360 in the stack 390. The pattern mask 380 may be a soft mask or a hard mask. Some hard masks that may be used include a polysilicon hard mask and a metal hard mask such as a tungsten hard mask or a titanium nitride hard mask. Pattern mask 380 includes open areas 370 which expose underlying layers to etch chemicals during etching processes. The pattern mask 380 additionally includes covered regions that protect underlying layers from etch chemicals. Regions of the stack 390 under the open areas 370 that are not protected by the pattern mask 380 may undergo an etching process.

The article 300 can be etched through the pattern mask 380 to create cavities having approximately the shape of the openings in the pattern mask 380. Etchants will typically also etch the pattern mask 380 at some etch rate. The gas mixture may be controlled so that an etch selectivity of the nitride and oxide layers to the pattern mask is approximately 5:1 or greater. Thus, the etch rate of the pattern mask may be 20% of the etch rate of the nitride and oxide layers, or lower.

Figure 4:
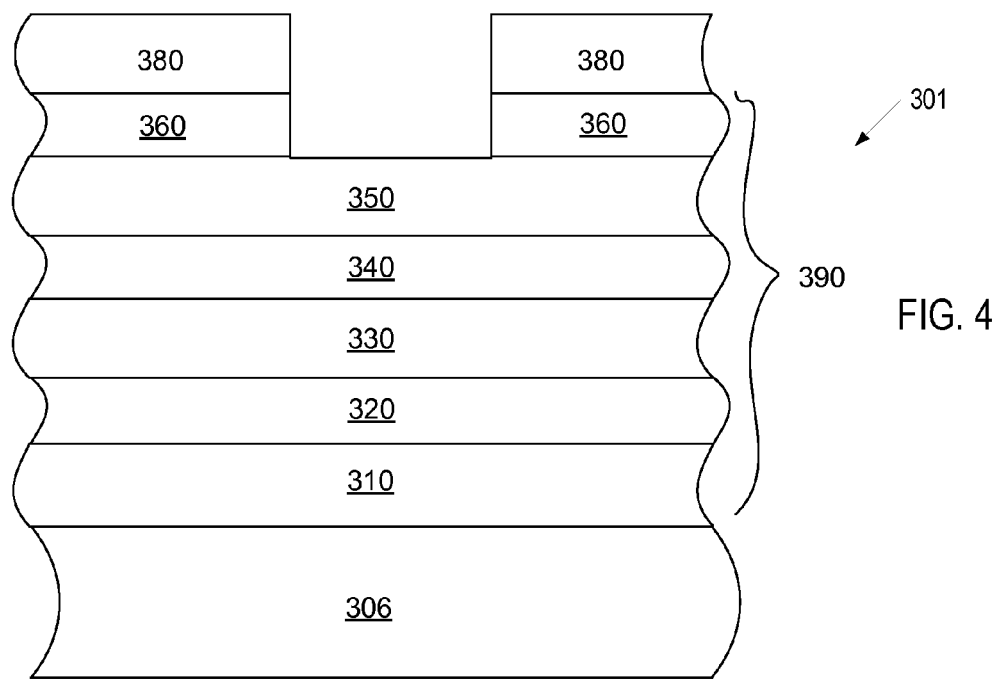
FIG. 4 depicts a sectional view of one embodiment of multiple oxide layers and nitride layers on a substrate where an oxide layer has been etched.

FIG. 4 is a sectional view of an article 301 including the substrate 306 and the stack 390 of oxide layers 360, 340, 320 and nitride layers 350, 330, 310 after oxide layer 360 has been etched. A plasma etch process has etched a cavity in the oxide layer 360 at the open area 370. Ionized molecules of a gas mixture of $C_4F_6H_2$, and at least one other fluorocarbon (e.g., $C_4F_8$, $C_4F_6$, or $CH_2F_2$) may be controlled in a process chamber to perform an anisotropic etch of oxide layer 360 at an oxide etch rate. The process chamber operating conditions and the gas mixture used for the etch process control the oxide etch rate. Other carrier gases, such as argon, may be included. Other gases to counteract possible polymer generation such as oxygen may also be included.

FIG. 5 depicts is a sectional view of an article 302 including the substrate 306 having the stack 390 of oxide layers 360, 340, 320 and nitride layers 350, 330, 310 after nitride layer 350 has been etched. Ionized molecules of a gas mixture of $C_4F_6H_2$ and at least one additional flurocarbon are controlled in a process chamber to perform an anisotropic etch of the oxide layer 360 at an oxide etch rate and then perform an anisotropic etch of the nitride layer 350 at a nitride etch rate. Other carrier gases, such as argon, may be included. Other gases to counteract possible polymer generation such as oxygen may also be included.

In one embodiment, an oxide to nitride etch selectivity is approximately 1:1, meaning that the etch rate of the oxide layers is approximately equal to the etch rate of the nitride layers. Alternatively, the oxide to nitride etch selectivity may be adjusted to cause a greater oxide etch rate or a greater nitride etch rate. The oxide to nitride etch selectivity may be adjusted based on conditions of the oxide layers and/or nitride layers to be etched. For example, if a stack of alternating oxide layers and nitride layers has thicker nitride layers than oxide layers, then the nitride etch rate may be increased in relation to the oxide etch rate. Similarly, if the oxide layer thickness is greater than the nitride layer thickness, then the oxide etch rate may be increased relative to the nitride etch rate. In some embodiments the oxide to nitride etch selectivity may be adjusted between approximately 1:2 and 2:1.

The etch rate for a cavity may depend on the type of cavity to be etched. In particular, etched cavities may be divided into the categories of trenches and holes. Holes may have a horizontal diameter that is much less than a vertical depth of the holes. This creates a very high aspect ratio that may be on the order of 50:1 or greater in some embodiments. To etch a hole in oxide and nitride layers on a substrate, a molecule first travels to the etch front at the bottom of the hole. Since radicals are neutral and thus have no charge, radicals are not propelled to the etch front by the electromagnetic field. The primary molecules that travel to the etch front are ions that are accelerated by the electromagnetic field produced by the etch reactor. The provided etch gases are decomposed into additional species, some of which are ions having charge. These ions are accelerated by the field and propelled to the etch front.

Due to the alternating oxide and nitride layers on the substrate, both ions that etch nitride layers and ions that etch oxide layers should be propelled to the etch front. By managing the ratio of the etch gas species that are provided, the ratio of ions that will etch oxides (e.g., ions containing F) to the ratio of ions that will etch nitride (e.g., ions containing H) can be controlled.

Trenches may be narrow in one direction but wide in another direction. Since trenches have a wide opening along one dimension, radicals that will etch nitrides and/or oxides will naturally propagate to the etch front. Accordingly, even for trenches having a high aspect ratio (e.g., 50:1) in one horizontal direction, trenches may be etched by both ions and radicals. The ions have directionality, while the radicals do not have directionality. In one embodiment, a majority of the etch species that etch trenches are ions, and a minority of the etch species are radicals. However, the addition of the radicals may change the etch rate of the trenches as compared to the etch rate of holes.

FIG. 6 illustrates a sectional view of an article 303 including the substrate 306 having the stack 390 of oxide layers 360, 340, 320 and nitride layers 350, 330, 310 that has undergone an etch process. The process has etched a cavity 620 in the oxide layers and in the nitride layers. The cavity 620 has an aspect ratio of depth 600 to width 610. The depth to width aspect ratio may be between 10 to 1 (10:1) and 100 to 1 (100:1) in embodiments. However, other aspect ratios are also possible. The etched cavity 620 may be a trench type cavity or a pin hole type cavity. The cavity 620 may have a depth of up to 4 microns in some embodiments. In other embodiments, the cavity 620 may have a depth of over 4 microns. In one particular embodiment, the trench has a depth of 3-4 microns.

Figure 7:
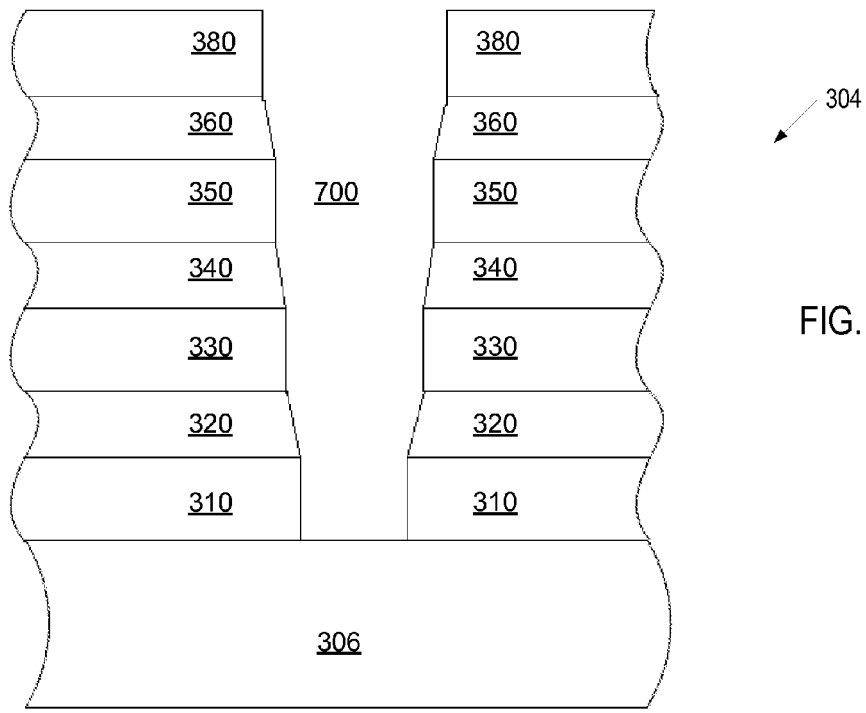
FIG. 7 depicts a sectional view of one embodiment of multiple etched oxide layers and nitride layers on a substrate where a selectivity of the oxide etch rate to the nitride etch rate has caused a tapered cavity.

FIG. 7 shows a sectional view of an article 304 including the substrate 306 having the stack of alternating oxide layers 360, 340, 320 and nitride layers 350, 330, 310 that has undergone an etch process. The process has etched a cavity 700 in the oxide layers and in the nitride layers. In one embodiment, the cavity 700 has a tapered cross sectional shape in which a bottom of the cavity is narrower than a top of the cavity. In one embodiment, an etch process having a higher oxide etch rate than nitride etch rate may produce cavities with a tapered cross section as shown.

Figure 8:
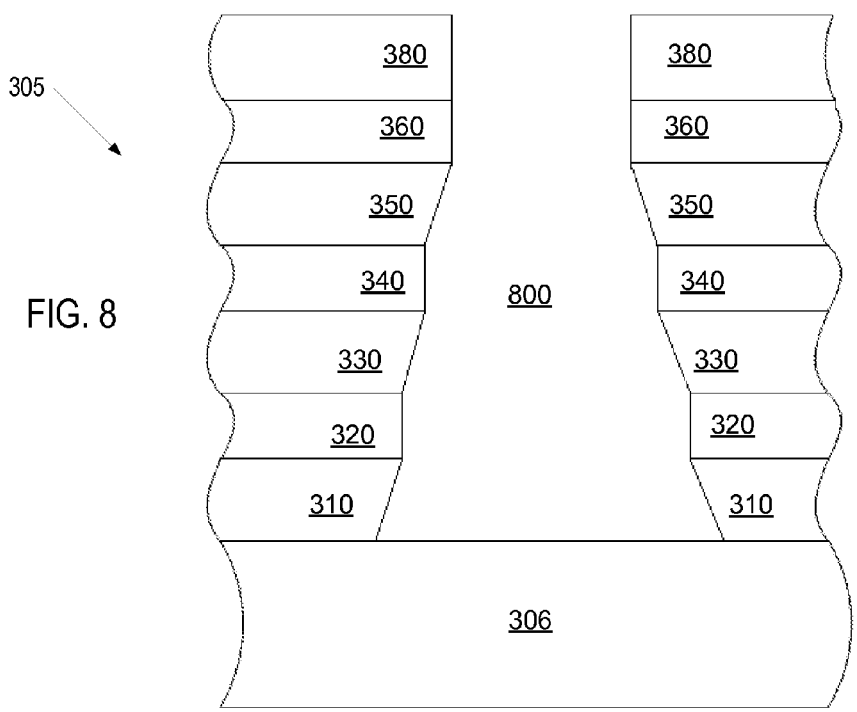
FIG. 8 depicts a sectional view of one embodiment of multiple etched oxide layers and nitride layers on a substrate where cavity selectivity of the nitride etch rate to the oxide etch rate has caused a bowed cavity.

FIG. 8 illustrates a sectional view of an article 405 including the substrate 306 having the stack of alternating oxide layers 360, 340, 320 and nitride layers 350, 330, 310 that has undergone an etch process. The process has etched a cavity 800 in the oxide layers and in the nitride layers. The cavity 800 has a bowed cross section, which is produced by a process having a higher nitride etch rate than oxide etch rate.

Figure 9:
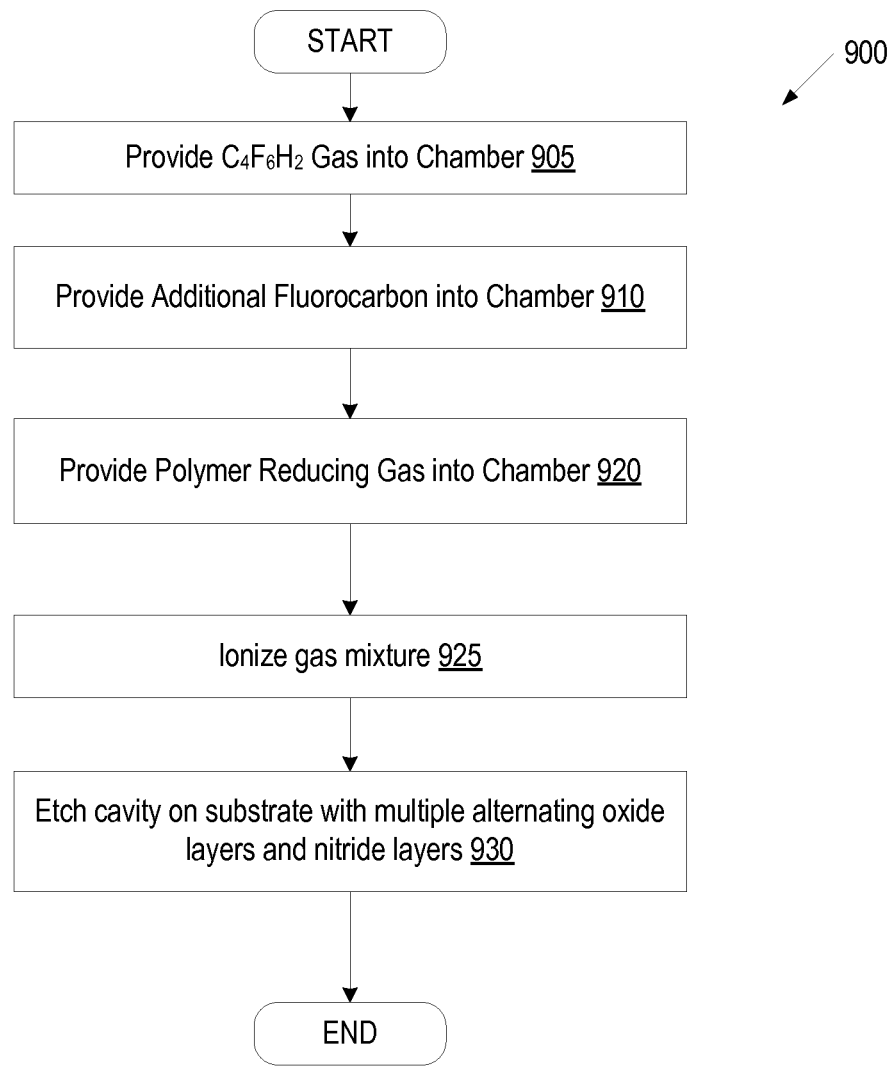
FIG. 9 depicts a process flow chart for one embodiment of an etch process that uses $C_4F_6H_2$.

FIG. 9 is a flow chart of one embodiment of a process 900 for etching a substrate using a $C_4F_6H_2$ containing gas. A substrate having a stack of alternating oxide layers and nitride layers is placed into a process chamber. A $C_4F_6H_2$ gas is flowed into the process chamber at block 905 of process 900. A carrier gas such as Ar may be used to provide the gas into the chamber.

At block 910, at least one additional fluorocarbon is provided into the chamber. The additional fluorocarbon may be a hydrogen-free fluorocarbon such as $C_4F_6$, $C_4F_8$, $C_5F_8$, $C_6F_6$, and so on. The additional fluorocarbon may also be a hydrogen containing fluorocarbon such as $CF_2H_2$. In one embodiment, $C_4F_6$ and $CF_2H_2$ are flowed into the process chamber. In another embodiment, $C_4F_8$ and $CF_2H_2$ are flowed into the process chamber. A carrier gas may be used to flow the additional fluorocarbon gas. Oxygen gas or nitrogen gas may also be provided into the chamber at block 920. The oxygen and/or nitrogen gas may be used to control polymer generation. Other gases may also be added.

Note that though the providing of different gases into the chamber is shown as separate blocks, these gases may be provided to the chamber together. For example, these gases may all be flowed into the chamber at the same time. In such an instance, the gases may begin to mix before they enter the chamber, or may mix in the chamber.

The etch mechanism for oxides is different from the etch mechanism for nitrides. Oxides are etched through physical bombardment using fluorocarbons (e.g., $CF_3$). High energy fluorocarbon ions bombard the cavity at the etch front to break covalent bonds of the $SiO_x$. The Si molecule then bonds to F molecules from ions to form a silicon fluoride (e.g., $SiF_4$), which is then evacuated from the chamber. The oxide etching is an anisotropic etch mechanism.

Nitrides are chemically etched by ions containing hydrogen. The hydrogen from an ion chemically breaks the bond between the silicon and nitrogen in the nitride layer. The hydrogen and carbon from the ion then bonds with nitrogen to form HCN, which is evacuated from the chamber. The etching of the nitride layers is an approximately isotropic etch process. The different etch mechanisms of oxides and nitrides introduce a challenge when etching alternating oxide and nitride layers. This challenge is exacerbated when the etch is to be performed to create high aspect ratio cavities.

Neutral molecules (e.g., radicals) do not penetrate to the etch front for high aspect ratio cavities. Accordingly, ions should be generated and then accelerated to the etch front by an electromagnetic field. To etch the nitride layers, hydrogen containing ions are provided. To etch the oxide layers, fluorine containing ions are provided. The gas $C_4F_6H_2$ dissociates into gases that contain both fluorine and hydrogen. Accordingly, $C_4F_6H_2$ can dissociate into ions that will etch both nitride layers and oxide layers. However, $C_4F_6H_2$ may dissociate into ions that will etch nitride layers faster than they will etch oxide layers. To control the nitride to oxide etch selectivity, another gas may be mixed with the $C_4F_6H_2$ gas. Hydrogen-free fluorocarbon gases (e.g., $C_4F_6$ and $C_4F_8$) dissociate into species that will etch oxide layers. For example, these gases may dissociate into fluorocarbons such as the $CF_3$ ion, which will etch oxides. Accordingly, by adding $C_4F_6$ and/or $C_4F_8$ to the $C_4F_6H_2$ in the chamber, the oxide etch rate may be increased relative to the nitride etch rate. In one embodiment, the ratio of $C_4F_6H_2$ to $C_4F_6$ is 1:1. Ratios of 1:2 to 2:1 may also be used. In one embodiment, a ratio of $C_4F_6H_2$ to $C_4F_8$ is 1:1. Ratios of 1:1 to 1:3 may also be used.

Typically the nitride layers will be thicker than the oxide layers by up to about 20%. Accordingly, in one embodiment the etch rate of the nitride layers is approximately 20% greater than the etch rate of the oxide layers. Thus, the nitride to oxide etch selectivity may vary from 1:1 to 1.2:1 in one embodiment.

Some gases may form polymer precursors on a surface of the material to be etched at the etch front. The gas mixture may be controlled to control the generation and removal of polymers. Polymers may be formed by radicals such as $C_2F_3$ radicals, $H_2$ radicals, $C_2F_2$ radicals, $C_2F_3$ radicals, $C_2F_4$ radicals, and so on. The formation of polymeric layers in fluorocarbon etching may help to generate a vertical profile for etched cavities. The degree of polymerization and the composition of the polymer may be controlled by adjusting the gas mixture used in the etch process. While too little polymerization will degrade protection to the sidewall and selectivity to photoresist, a slight excess of polymerization in very high aspect-ratio cavities will cause etch stop towards the bottom of the cavity. The carbon concentration in the polymer will impact its resistance to being etched by the plasma and the conformality of its deposition. Higher plasma resistance of the polymer increases photoresist selectivity, while conformal deposition of the polymer helps to control the profile of the high aspect ratio hole etch. The F/C ratio is the ratio of fluorine to carbon atoms in a fluorocarbon molecule, and the molecular bonding structure is the way these F and C atoms bond together. The F/C ratio and the molecular bonding structure may be used for controlling polymerization and the properties of the polymer. A high F/C ratio indicates a strongly etching gas while a low F/C ratio usually results in extensive polymerization. Once polymers are formed, ions may bombard the polymer to break its surface anisotropically. Oxygen may also burn off or otherwise remove the polymer.

At block 925, the gas mixture is ionized using a magnetic field. Table 1 above shows some decomposed gas species that various provided gases may decompose into. Table 2 above shows species breakdown ratios for a $C_4F_6H_2$ gas.

Process parameters for an etch process using a $C_4F_6H_2$ gas include a gas flow and chamber operating conditions to produce a plasma. In one embodiment, the RF Power for a plasma producing magnetic field is set at 100-200 MHz and 0-1000 W. In one embodiment, a power of 150-350 W is used. In another embodiment, a power of about 200 W is used. In one embodiment, a frequency of 162 MHz is used along with the power of 0-1000 W. Gas flow rates of one or more gases may be adjusted to control an oxide layer etch rate and a nitride layer etch rate. Additionally, gas flow rates may be adjusted for polymer generation control.

At block 930, a cavity is etched into alternating oxide and nitride layers on a substrate using the produced ions. An etch rate of the nitride layers may be about 400 nanometers per minute (nm/min.) to about 500 nm/min. An etch rate of the oxide layers may be about 400 nm/min. to about 500 nm/min. In one embodiment, a nitride to oxide etch selectivity is between about 1:1 and 1.2:1. Other etch selectivity may also be used.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   providing a first gas comprising $C_4F_6H_2$ into a chamber of an etch reactor;
   providing a second gas comprising $C_4F_6$ into the chamber, wherein a ratio of the $C_4F_6H_2$ to the $C_4F_6$ is between 1:2 and 2:1;
   ionizing the first gas comprising the $C_4F_6H_2$ and the second gas comprising the $C_4F_6$ to produce a plasma comprising a plurality of ions; and
   etching a substrate using the plurality of ions.

2. The method of claim 1, wherein the substrate comprises a plurality of alternating oxide layers and nitride layers and wherein a first etch rate for the oxide layers differs by less than 20% from a second etch rate for the nitride layers.

3. The method of claim 2, further comprising:
   controlling a ratio between the first etch rate of the oxide layers and the second etch rate of the nitride layers by adjusting a ratio of the $C_4F_6H_2$ to the $C_4F_6$.

4. The method of claim 1, further comprising:
   providing a third gas comprising $C_4F_8$ into the chamber.

5. The method of claim 1, wherein the plasma comprises at least one of $C_3F_3H_2$, $CF_3$, $C_4F_3H_2$, $C_4F_5H_2$, $C_3F_2H_2$, $C_3F_2H$, $CF$, $CF_2$, $CHF$, $C_2F_2H_2$ or $C_2F_3H$.

6. The method of claim 1, further comprising:
   providing a third gas comprising $CH_2F_2$ into the chamber.

7. The method of claim 1, wherein the etching produces a cavity in the substrate having a depth to width aspect ratio ranging from 10:1 to 100:1.

8. The method of claim 1, further comprising:
   maintaining a plasma power of 150-350 W during the etching.

9. A method comprising:
   providing a gas mixture comprising at least one of a) $C_4F_6H_2$ and $C_4F_6$ at a ratio of between 1:2 and 2:1 or b) $C_4F_6H_2$ and $C_4F_8$ at a ratio of between 1:1 and 1:3;
   ionizing the gas mixture to form a plasma comprising 37-84% $C_3F_3H_2$, 8-28% $CF_3$, 8-14% $C_4F_5H_2$, 0-11% $C_3F_2H$, 0-10% $CF$, and 0-3% $CF_2$; and
   anisotropically etching a substrate comprising an alternating stack of oxide layers and nitride layers using the plasma.

10. The method of claim 9, wherein an etch rate of the oxide layers is about 400-500 nm/min and an etch rate of the nitride layers is about 400-500 nm/min.

11. A method comprising:
    providing a first gas comprising $C_4F_6H_2$ into a chamber of an etch reactor;
    providing a second gas comprising $C_4F_8$ into the chamber, wherein a ratio of the $C_4F_6H_2$ to the $C_4F_8$ is between 1:1 and 1:3;
    ionizing the first gas comprising the $C_4F_6H_2$ and the second gas comprising the $C_4F_8$ to produce a plasma comprising a plurality of ions; and
    etching a substrate using the plurality of ions.

12. The method of claim 11, wherein the substrate comprises a plurality of alternating oxide layers and nitride layers and wherein a first etch rate for the oxide layers differs by less than 20% from a second etch rate for the nitride layers.

13. The method of claim 12, wherein an etch rate of the oxide layers is about 400-500 nm/min and an etch rate of the nitride layers is about 400-500 nm/min.

14. The method of claim 12, further comprising:
controlling a ratio between the first etch rate of the oxide layers and the second etch rate of the nitride layers by adjusting a ratio of the $C_4F_6H_2$ to the $C_4F_8$.

15. The method of claim 11, wherein the plasma comprises at least one of $C_3F_3H_2$, $CF_3$, $C_4F_3H_2$, $C_4F_5H_2$, $C_3F_2H_2$, $C_3F_2H$, $CF$, $CF_2$, $CHF$, $C_2F_2H_2$ or $C_2F_3H$.

16. The method of claim 11, further comprising:
providing a third gas comprising $CH_2F_2$ into the chamber.

17. The method of claim 11, wherein the etching produces a cavity in the substrate having a depth to width aspect ratio ranging from 10:1 to 100:1.

18. The method of claim 11, further comprising:
providing a third gas comprising $C_5F_8$ or $C_6F_6$ into the chamber.

19. The method of claim 11, further comprising:
providing a third gas comprising $O_2$ or Ar into the chamber.

20. The method of claim 11, further comprising:
maintaining a plasma power of 150-350 W and a frequency of 100-200 MHz during the etching.

\* \* \* \* \*